United States Patent [19]

Drage et al.

[11] 4,207,466
[45] Jun. 10, 1980

[54] INFRARED PROXIMITY DETECTING APPARATUS

[76] Inventors: David J. Drage, 1223 W. Barry Ave., Chicago, Ill. 60657; Lawrence N. Harkness, 115 N. Princeton Ave., Villa Park, Ill. 60181

[21] Appl. No.: 881,420

[22] Filed: Feb. 27, 1978

[51] Int. Cl.² ............................ G01J 1/00; B60Q 1/00
[52] U.S. Cl. .................................... 250/338; 250/221; 250/341; 340/556
[58] Field of Search ............... 250/341, 339, 338, 221; 340/567, 541, 557, 555, 556; 343/5 PD; 328/138

[56] References Cited

U.S. PATENT DOCUMENTS

| | | | |
|---|---|---|---|
| 3,056,106 | 9/1962 | Hendricks | 340/567 |
| 3,549,892 | 12/1970 | Perlman | 250/221 |
| 3,706,961 | 12/1972 | Sugiura | 343/5 PD |
| 3,716,833 | 2/1973 | Roth | 340/556 |
| 3,859,647 | 1/1975 | Ross | 250/221 |

Primary Examiner—Alfred E. Smith
Assistant Examiner—Carolyn E. Fields
Attorney, Agent, or Firm—Allegretti, Newitt, Witcoff & McAndrews

[57] ABSTRACT

A proximity detecting apparatus for generating a beam of infrared light rays in the form of successive radiation pulses occuring at a predetermined frequency for reflection off objects moving within the proximity of the apparatus. A photo-detector device positioned adjacent to the radiation beam senses the reflected rays and responsively produces an output signal. Other light radiation and electrical signal noise sensed by the detector are filtered from the output signal according to the pulse width and frequency of pulse radiation generated by the beam. A detected signal is established as valid only if the signal and the infrared source are in frequency synchronization and if an unbroken pulse train is detected for a predetermined length of time.

11 Claims, 12 Drawing Figures

INFRARED PROXIMITY DETECTING APPARATUS

BACKGROUND OF THE INVENTION

The invention relates to proximity detecting apparatus, and more particularly to infrared radiation proximity detectors.

Proximity detectors are devices utilized to detect the presence of objects moving within a prefixed area at a proximate distance from the detector. Such devices may use electrical waves, light waves, mechanical sensing apparatus, and the like, to sense the presence of the proximate objects.

However, the use of infrared radiation in the art of proximity detection presents problems unique of its own. Where the proximity detector is to be used out of doors, spurious radiation from the sun presents false signals which are detected by the detector. Cloud changes and bright sunlight reflections further exacerbate attempts to control the radiation impinging upon the detector. And where the proximity detector is to be used indoors, spurious radiation can also occur from incandescent lights.

Also, where the source of infrared radiation used by the detector is supplied by an infrared light-emitting diode, the inefficient radiation output capacilities found with ordinary light-emitting diodes impose power consumption and use limitation requirements in the design of such proximity detectors.

SUMMARY OF THE INVENTION

It is therefore an object of the present invention to provide an improved proximity detecting apparatus.

It is yet another object of the present invention to provide a proximity detecting apparatus utilizing infrared radiation.

It is yet another object of this invention to provide an optimal, useable, directional photon output from an ordinary infrared light-emitting diode, for increasing the radiation output range.

It is yet another object of the present invention to provide an infrared radiation proximity detecting apparatus in a water faucet control system for automatically producing water flow when a user places his hands under the water spigot.

A related object of this invention is to provide an infrared radiation proximity detecting apparatus in an overhang protection system for signaling a truck driver, and others, that the truck will not pass beneath the protected overhang.

The objects of this invention are accomplished by the present embodiment of the invention which includes an infrared radiation source for emitting regular pulses of infrared radiation at a predetermined frequency and pulse width. When an object enters the proximity range, the infrared radiation pulses are reflected back to a photodetector positioned relative to the source radiator. The known frequency and pluse width of the source pulses are utilized to eliminate any spurious non-valid signals detected by the system. In order to utilize an ordinary infrared light-emitting diode, an embodiment of the invention arranges the diode at the focus point of a truncated paraboloid, and drives the diode with a large amount of current at a low duty cycle.

Other objects, features and advantages of the invention will be readily apparent from the following description of the preferred embodiment taken in conjunction with the appended claims, and accompanying drawings.

DESCRIPTION OF THE DRAWINGS

FIG. 8 shows the output circuitry of the detector embodied in the water faucet control system of FIG. 7.

DESCRIPTION OF THE PREFERRED EMBODIMENTS

Figure 1:
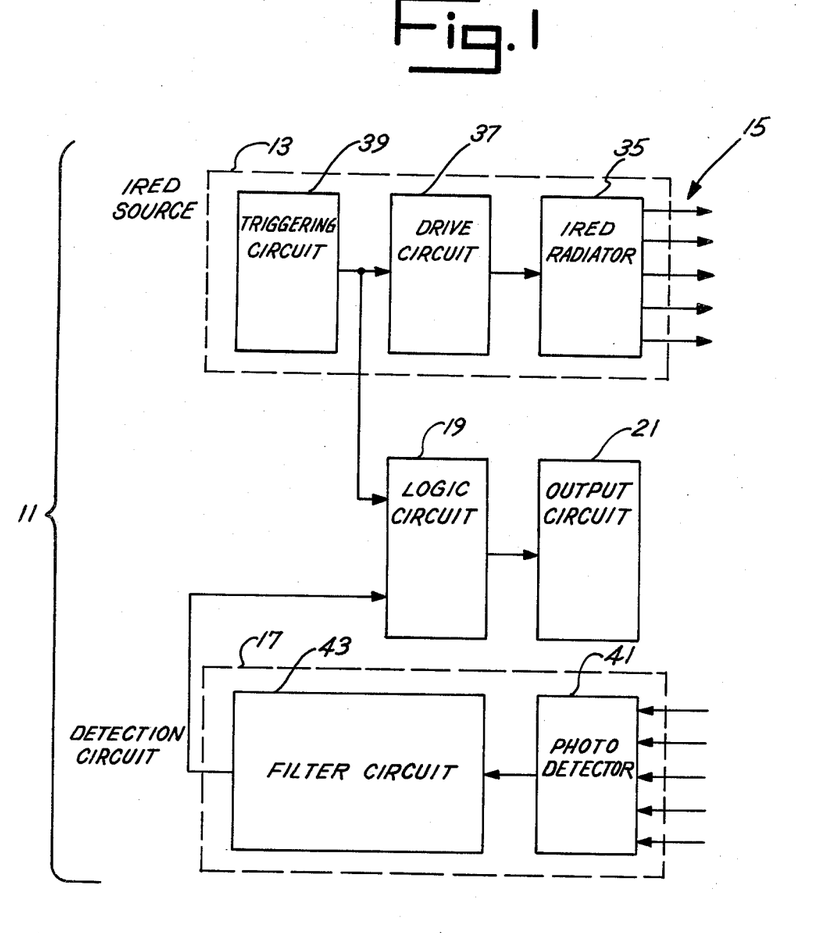
FIG. 1 is a block diagram of a preferred embodiment of the detection apparatus of the present invention.

Referring to FIG. 1, a proximity detector 11 includes an infrared (IR) radiation source 13 operable for generating pulses of infrared radiation in a general direction as illustrated by rays 15. An infrared detection circuit 17 is positioned with respect to IR source 13 for receiving rays 15 as the same are reflected back from an object moved within the proximity of IR source 13. Detection circuit 17 produces an electrical signal output to a logic circuitry 19 which discriminates between false and valid signals detected by detection circuit 17, where valid signals are those signals corresponding to infrared radiation generated by source 13. Logic circuitry 19 produces an output signal for driving output function circuitry 21 responsive to the detection of valid signals of source radiation 15.

IR source 13 includes an infrared radiator 35 which is actuable by an electrical signal to generate infrared radiation. A drive circuitry 37 generates the proper electrical signal for driving radiator 35. A triggering circuit 39 successively actuates drive circuit 37 at a predetermined frequency for causing a radiation output to be produced by radiator 35 in a pulse-like fashion having predetermined pulse width and frequency.

Detection circuit 17 will sense reflected radiation 15 via photodetector 41 responsively producing an electrical signal which will oscillate in pulse-like fashion corresponding to the pulse output frequency of IR source 13. The photodetector output signal passes to a filter circuit 43 for eliminating ambient light level signals and background noise signals, and directing the resultant signal as an input to logic circuitry 19.

Logic circuitry 19 monitors the output signal from filter circuit 43 in conjunction with an output signal from triggering circuit 39 for determining the synchronization of the two signals. After a predetermined time period of synchronous signal reception, logic circuitry 19 assumes that the signal from filter circuit 43 is a proper detection of source 13 signals, i.e. valid signals, and responsively produces an electrical signal output to output circuitry 21 for performing a desired functional operation.

Figure 2:
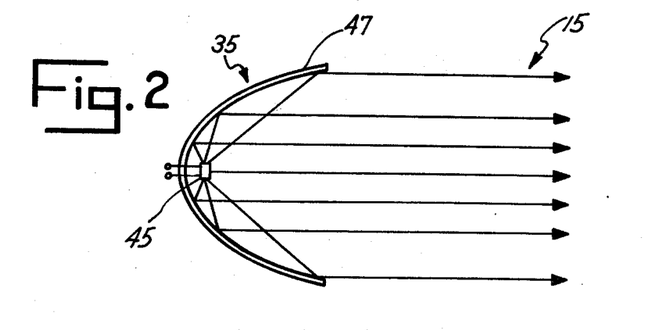
FIG. 2 is a cross-section view of the infrared radiator of the embodiment of FIG. 1.

Referring to FIG. 2, infrared radiator 35 includes an infrared light-emitting diode 45 (IR LED) which is positioned at the focus point of a truncated paraboloid reflector 47 for collimating radiation rays 15. Reflector 47 is formed of a highly reflective interior surface and may be formed, for example, from polystyrene plastic bearing an aluminized coating on its interior surface. Reflector 47 may be made from other materials and take on other aspheric shapes for concentrating and directing the radiation along a desired direction, as will suggest itself to those skilled in the art.

The positioning of IR LED 45 at the focus point of paraboloid 47 is an important feature of the embodiment that permits efficient use of the LED. Generally, the use of IR LEDS has been limited to use of IR rays emanating from a single surface of the LED, i.e, the top surface. However, infrared radiation is in fact emitted from practically all surfaces of the LED. The positioning of the LED at the focus point of the paraboloid serves to collect radiation coming from all faces of the LED providing greater useable radiation output from an LED device. Forming the reflector in a paraboloid shape also serves to substantially collimate the radiation beam 15.

The placement of the LED chip 45 with respect to the paraboloid focus point has been found to be critical. The front face of the LED chip is positioned off center such that the center of the LED chip is at the focus point. A large amount of photons are emitted from the side faces of the LED chip and, therefore, the side faces are positioned to provide the photons which are emitted from the side faces to substantially appear to emanate from the focus point.

Figure 3:
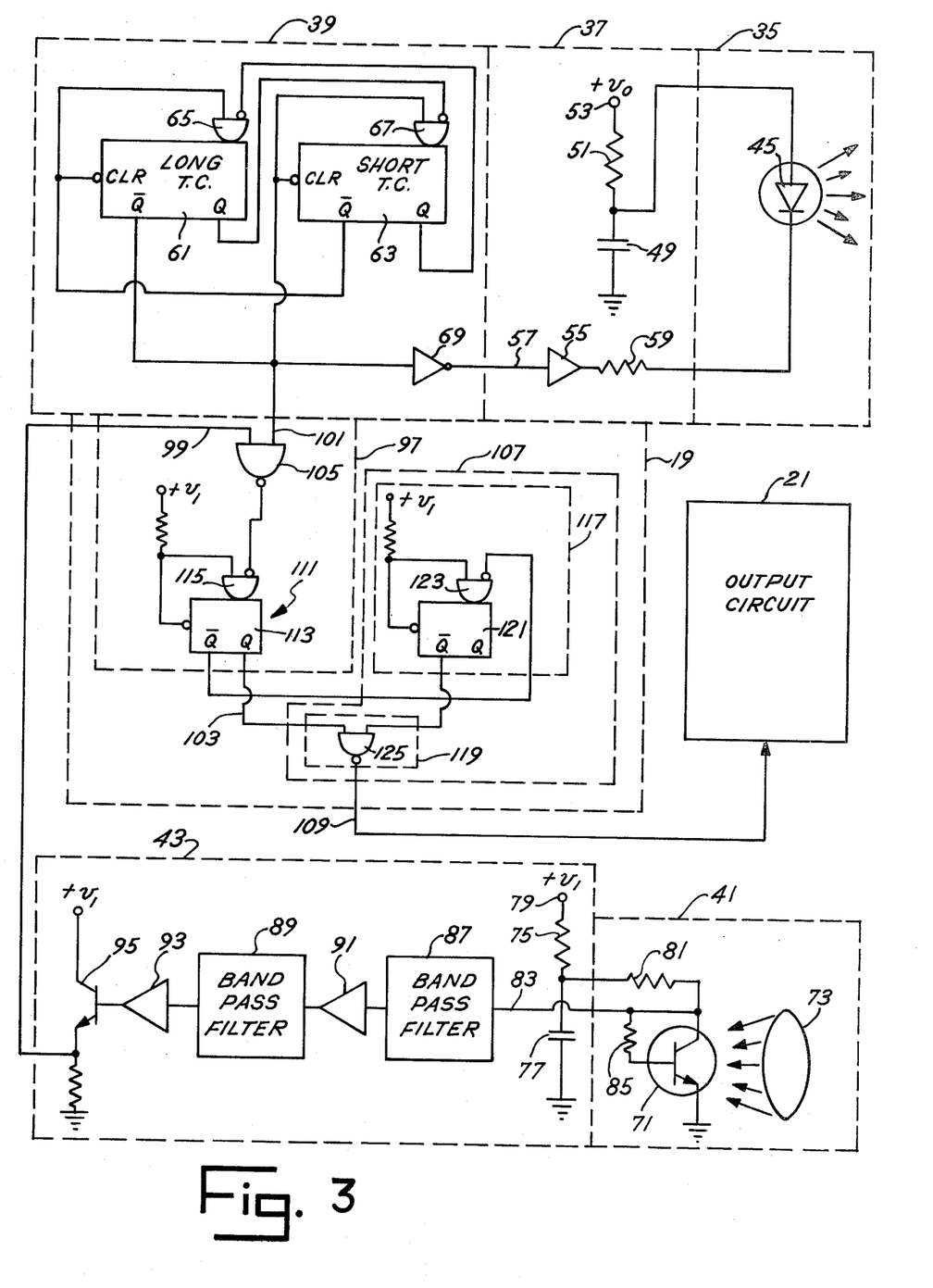
FIG. 3 is a schematic diagram of an electrical circuit embodiment of FIG. 1.

As shown in FIG. 3, IR LED 45 of radiator 35 is interconnected to drive circuit 37 which includes a capacitor 49 connected in series with a resistor 51. A positive voltage Vo (for example 15 volts) is supplied at node 53 for development across capacitor 49 and resistor 51. Capacitor 49 is charged by the power supplied from node 53 for forming a current reservoir for actuation of LED 45. A current amplifier 55 is driven to ground when a negative signal is placed along line 57, for effectually grounding LED 45 through load resistor 59 causing a current pulse supplied by capacitor 49 to flow through LED 45.

Generally, IR LED 45 is rated to be driven by an average current in the range of milliamps. The present circuitry however, drives the IR LED 45 with over 50 times its normal current rating. For example, a ½% duty cycle may be used by driving LED 45 ½% of the time with 2 amps of current and the remaining 99½% of the time the LED is kept off.

The use of reservoir capacitor 49 provides a source of high current and yet utilizes a low current power supply at node 53. Resistor 51 limits the current drain from node 53 and is established at a value in conjunction with the value of capacitor 49 to provide a time constant value to permit capacitor 49 to recharge between each trigger pulse produced by triggering circuit 39. Resistor 51 and capacitor 49 also serve as a decoupler to prevent noise from feeding into the power supply and to other circuits through node 53.

The driving of LED 45 by a high current output from drive circuit 37 is an important feature of the embodiment that permits a greater amount of photon output produced by the IR LED. This high power driving of the LED in conjunction with the photon collection performed by paraboloid reflector 47 provides an efficient and long range IR beam generation from an ordinary IR LED.

To provide still greater photon output, more than one IR LED can be driven by drive circuit 37 by placing the LEDS in a series configuration with LED 45. The number of IR LEDS used in series is limited only by the breakdown characteristics of current amplifier 55, as is understood by those skilled in the art. Reflector 47 can be conformed to more than one LED by shaping the reflector, for example, in a parabolic truncated cylinder-like shape having a cross section as illustrated by FIG. 2. In the alternative, a plurality of reflectors 47 may be utilized, each reflector associated with a single IR LED, as described hereinafter.

Drive circuit 37 is actuated by triggering circuit 39 which comprises two monostable multivibrators 61, 63 electrically interconnected for triggering one another via AND gates 65, 67. The monostable vibrators 61, 63 have different time constants, with vibrator 61 having a long time constant and vibrator 63 having a short time constant, to give a train of relatively short pulses with a low duty cycle. The pulse train output occurs at a predetermined frequency and is fed along line 57 to the drive circuit 37 via inverter gate 69.

Photodetector 41 includes a silicon phototransistor 71 positioned at the focal point of a lens 73 which serves to collect and focus radiation energy upon the active area of phototransistor 71. The lens may be established with various optical properties for defining the detector's specific field of view.

Detection of light radiation by phototransistor 71 allows current to flow through the phototransistor in proportion to the amount of radiation impinging thereupon. A resistor 75 and capacitor 77 across which a voltage level is placed via node 79 serve to decouple phototransistor 71 from the power supply in order to eliminate any noise from flowing down the power supply lines causing photo-transistor 71 to give a false signal. The detected signal appears across a load resistor 81 producing an output signal along line 83. Phototransistor 71 may have its base connected via a feed back resistor 85 to its collector to add stability to the phototransistor output.

As will suggest itself to those skilled in the art, other photosensitive devices may be used in place of a phototransistor 71 for providing an electrical signal along line 83 in proportion to the amount of radiation detected.

Output line 83 is connected to a pair of band pass filters 87, 89 and a pair of voltage amplifiers 91, 93 for A.C. coupling of the signal to eliminate unwanted ambient light levels and background noise received by phototransistor 71. Filter circuits 87, 89 have their time constants adjusted so that the pulse emitted by LED 45 will pass through with maximum amplitude and all other signals will be attenuated.

An emitter-follower transistor 95 serves to match the impedance of filter circuit 43 with logic circuit 19, amplifying the filtered signal to proper logic voltage and current levels for introduction to logic circuitry 19.

Logic control circuit 19 includes a signal-synchronous monitoring circuit 97 which receives a first input 99 which includes the train of detected pulses passing through filter circuit 43, and receives a second input 101 of the train of pulses produced by triggering circuit 39. The monitoring circuit 97 compares the synchronism of the signals at its two inputs 99,101 for producing a logic output signal along line 103. The output along line 103 will be a first logic level only when the source pulse train at input 101 and the detected pulse train at input 99 occur substantially in frequency synchronism.

The output of monitoring circuit 97 is fed to a timing circuit 107 for timing the continuity of the first logic level produced along line 103 with respect to a predetermined period of time. A logic output signal is generated along line 109 responsive to the output signal along line 103 lasting for a continuous time period greater than the predetermined time period established by timing circuit 107.

Monitoring the synchronization of the detected radiation pulse train with the emitted radiation pulse train establishes that the signals detected are valid signals reflected from an object within the proximity of the detector. Signals detected by the phototransistor 71 from sunlight, other artificial light or other spurious signals are thus eliminated by the logic circuit 19. The timing circuit 107 not only serves to further establish that the signal detected is valid, but also eliminates valid signals occurring during a short period of time as for example, due to birds flying or leaves falling through the radiation beam when the system is used out of doors.

The monitoring circuit 97 is formed of a NAND gate 105 which produces a low logic level output only when both inputs 99,101 are high. This provides a pulse output from NAND gate 105 when both the source pulses and the detected pulses are occurring at the same time.

This pulse output of NAND gate 105 feeds a missing pulse detector 11 which utilizes the known time constant of triggering circuit 39 for producing an output signal along line 103 so long as the synchronous pulse output of NAND gate 105 remains unbroken.

The missing pulse detector 111 includes a retriggerable monostable multivibrator 113 having a time constant of greater than once the time constant of triggering circuit 39 but less than twice the same constant (preferably close to twice the time constant). The synchrous signal from NAND gate 105 triggers multivibrator 113 to its triggered state via AND gate 115 and maintains its triggered state so long as the pulse train from NAND gate 105 remains unbroken.

Timing circuit 107 includes a timer 117 and a logic gate 119. Logic gate 119 interposes the output along line 103 of monitoring circuit 97 and the output along line 109 of logic circuitry 19. Logic gate 119 is controlled by timer 117 for effectively passing the output of line 103 to line 109 after a predetermined time period has elapsed, as established by timer 117.

Timer 117 receives the output of monitoring circuit 97 for timing the output's continuity with respect to a predetermined time period; if the output along line 103 remains continuous for the predetermined time period, the timer produces a control signal to logic gate 119. In the preferred embodiment, the complement of the output of line 103 is fed from the $\overline{Q}$ output of vibrator 113 to timer 117.

The timer 117 includes a retriggerable monostable multivibrator 121 having a time constant of typically 10 times that of the multivibrator 113. The triggered state output of multivibrator 113 triggers multivibrator 121 to its triggered state via AND gate 123. If the multivibrator 113 is maintained in its triggered state for a greater time period than the time constant of multivibrator 121, multivibrator 121 will reset to its initial stable state producing a control signal to logic gate 119. The time constant of multivibrator 121 is, of course, variable according to response time desired.

Logic gate 119 includes a two-input NAND gate 125 which receives the output of multivibrator 113 and the output of multivibrator 121. When the multivibrator 121 is reset to its initial stable state, NAND gate 125 produces an output indication on line 109. Thereafter, a break in the pulse train is sensed by multivibrator 113 causing its retriggering and thus signaling NAND gate 125 to discontinue its output indication. As will be understood by those skilled in the art, logic gate 119 may be formed of an AND gate in place of NAND gate 125 depending upon the logic requirements of output circuitry 21.

Thus, logic gate 119 produces an output along line 109 responsive both to the signal from pulse detector 111 indicating that the present pulse train is unbroken, and the signal from the timer 117 indicating that the unbroken train has occurred for a predetermined length of time.

Figure 4A:
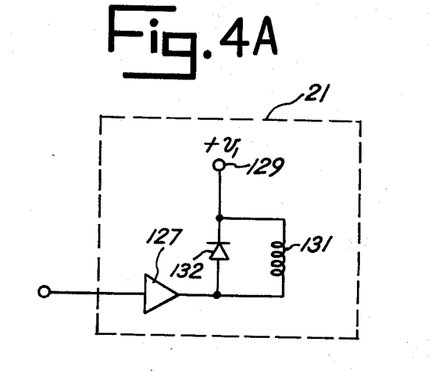
FIGS. 4A–4C and 8 are schematic diagrams of electrical circuit embodiments of the output circuit of FIG. 1.
Figure 4B:
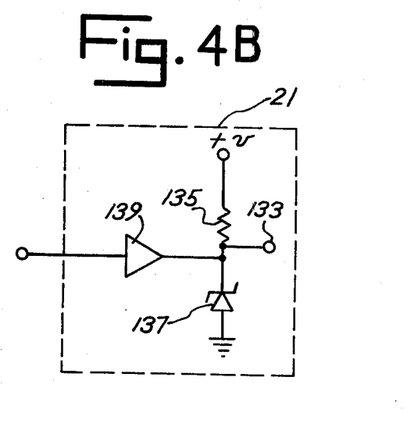
Figure 4C:
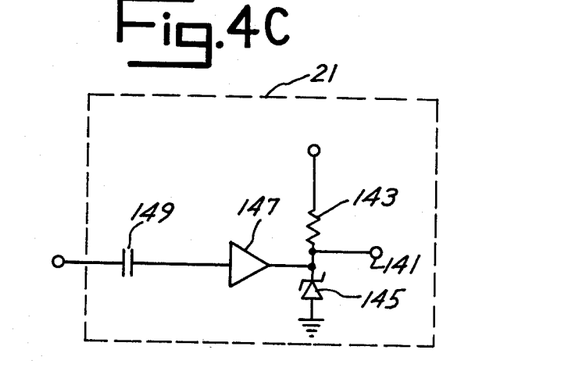

The output of logic circuitry 19 is fed along line 109 to output circuit 21 for performing the intended function to be produced upon the detection of the presence of an object within the monitored proximate distance. Referring to FIGS. 4A-4C, typical output circuitries are illustrated.

FIG. 4A illustrates output circuitry 21 as including a current amplifier 127. A negative logic output signal from logic circuit 19 switches current amplifier 127 for causing current to flow from positive power supplied at node 129 through solenoid coil 131. Coil 131 may serve as switch component to actuate an output device, as for example, an annunciator or solenoid operated valve. A diode 132 prevents damages to amplifier 127 from back e.m.f.

FIG. 4B illustrates output circuitry 21 as including an output node 133 which is held at a predetermined voltage level by resistor 135 and zener diode 137, for providing a logic 0 output signal. Amplifier 139 is switched to ground by logic circuit 19 to give a low impedance voltage output near ground at node 133 for providing a logic 1 output signal. The node 133 can be used to drive logic circuitry accordingly.

FIG. 4C illustrates output circuitry 21 as including an output node 141 from which a logic signal pulse is produced responsive to the output from logic circuitry 19. Output node 141 is held at a predetermined voltage level by resistor 143 and zener diode 145. Amplifier 147 is switched to ground by logic circuitry 19 giving a low logic output at node 141. Capacitor 149 begins charging until the capacitor reaches a level causing the output node 141 to return to its high logic output. The width of the pulse output is limited by the time constant of the capacitor 149 and the input impedance of the current amplifier 147.

Figure 5:
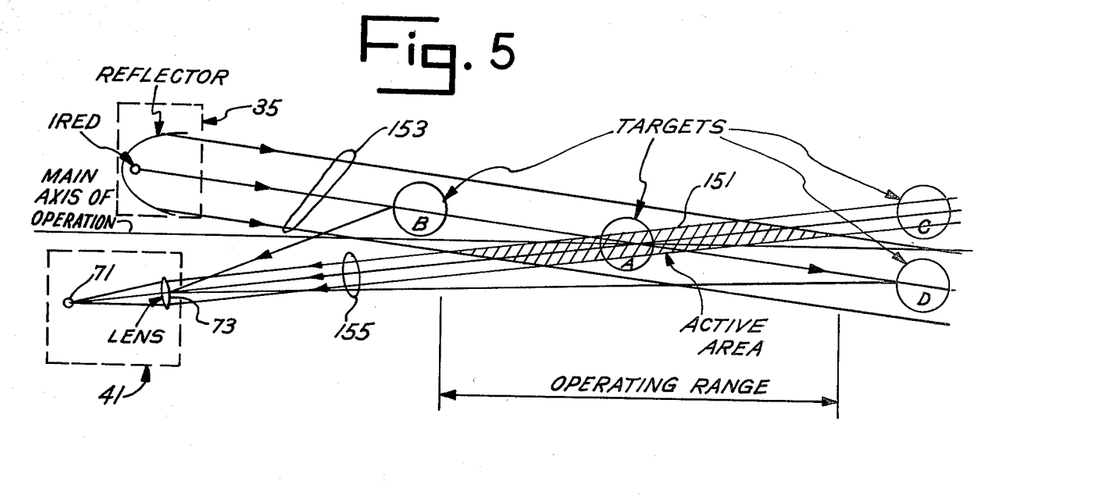
FIGS. 5, 6A and 6B illustrate different positional configurations of an infrared radiator and detector of the embodiment of FIG. 1.

Referring to FIG. 5, radiator 35 is illustrated in a fixed relationship to photo detector 41 for establishing an active area 151 in space wherein proximate objects are sensed. Object A is illustrated within active area 151. The collimated IR rays from beam 153 can be reflected from object A to pass within the field of view 155 of lens 73 to impinge upon the photosensitive device 71. However, object B is illustrated in a position not within active area 151. IR rays reflected from object B will not pass through the lens' specific field of view and thus will not impinge upon device 71. Objects C and D also are illustrated in positions not within active area 151. Object C is within the detectors' field of view 155, however, no transmitted radiation 153 can be reflected from the object. Object D is in a position to receive transmitted radiation 153, but the object is outside of the detectors's field of view 155.

As seen from the diagram of FIG. 5, a mere rotation of the radiator or detector, or the change of lateral spacing therebetween, will cause a change in the area of space traced out by active area 151. An active area can be formed at a relatively short distance from the detector and radiator despite the radiator and detectors's capability of a long range use.

Figure 6A:
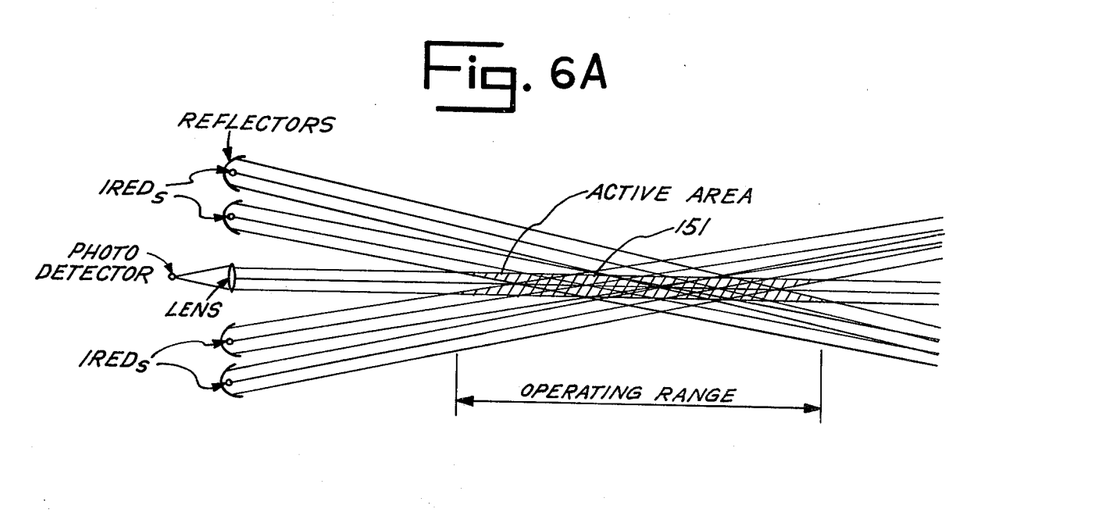
Figure 6B:
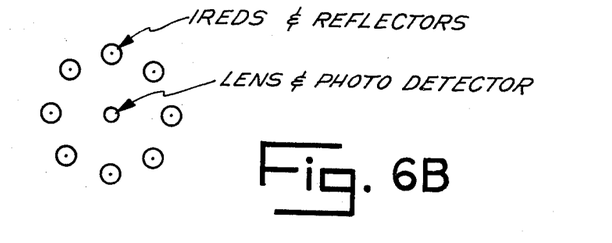

FIGS. 6A and 6B illustrate two different radiator-detector configurations for tracing an active area 151. FIG. 6A utilizes a pair of radiators positioned on opposite sides of a single detector and collinear therewith. FIG. 6B illustrates a face-on view wherein eight radiators are positioned about the circumference of a circle with the detector located at the circle's center. Both embodiments of FIGS. 6A and 6B produce a large photon output and are preferably used with long range applications.

The preferred embodiment, as described above, is directed to a reflective-type sensing by detector 17 of source radiation 15. As is understood by those skilled in the art, an incident-type sensing can also be utilized wherein detector 17 is positioned in line with source 13 for receiving direct transmission of IR pulses. Logic circuitry 91 could then be located with detector 17 and should receive an input representative of the frequency of operation of triggering circuit 39. Logic circuitry 19 would operate to produce an output signal whenever the detected signal train from source 13 was broken, just opposite in operation to the preferred reflective type.

Figure 7:
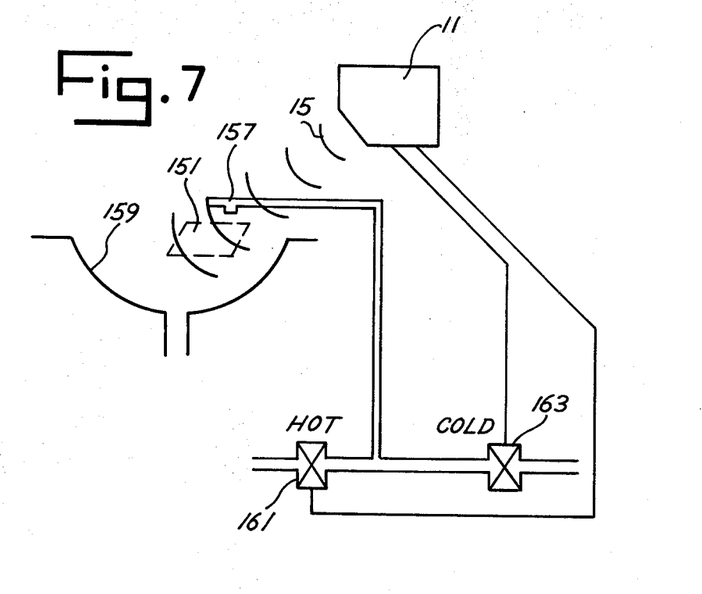
FIG. 7 is a cross-sectional diagrammatic view of a preferred embodiment of a water faucet control system of the present invention.

Referring to FIG. 7, a water faucet control system is illustrated which includes proximity detector 11 of FIG. 1. Detector 11 has its active area 151 established beneath a water spigot 157 for monitoring the presence of a person's hands below the spigot. Detector 11 controls water valves 161, 163 for producing water flow from the spigot into a wash basin 159 so long as the person's hands remain beneath the spigot.

Figure 8:
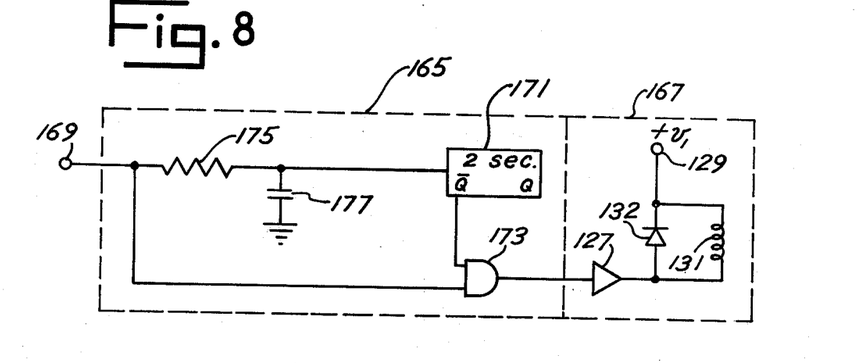

FIG. 8 illustrates output circuitry 21 of the detector 11 embodied in the water faucet control system of FIG. 7. Because hands in the act of washing could intermittently activate the system in an undesirable fashion, delay keep-on circuit 165 is combined with switch actuation circuit 167 which comprises the same components of FIG. 4A. The keep-on circuit 165 maintains actuation of circuit 167 so long as a logic input from logic circuit 19 appears at node 169 for a predetermined time period, e.g., two seconds.

Keep-on circuit 165 includes a retriggerable monostable multivibrator 171 which serves to keep amplifier 127 switched to ground via AND gate 173 for the predetermined time period after the logic input at node 169 changes from a negative to a positive input. A resistor 175 and capacitor 177 filter stray pulses from triggering multivibrator 171.

Both solenoid control valves 161, 163 of FIG. 7 can be activated by coil 131 of FIG. 8. In the alternative, two like circuits 167 can be driven by AND gate 173, with one circuit 167 driving the COLD water valve 163 and the other circuit 167 driving the HOT water valve 161. Double-pole, double-throw switches could then be placed between AND gate 173 and each amplifier 127 for driving the HOT and COLD water valves independently of the proximity detector 11.

Figure 9:
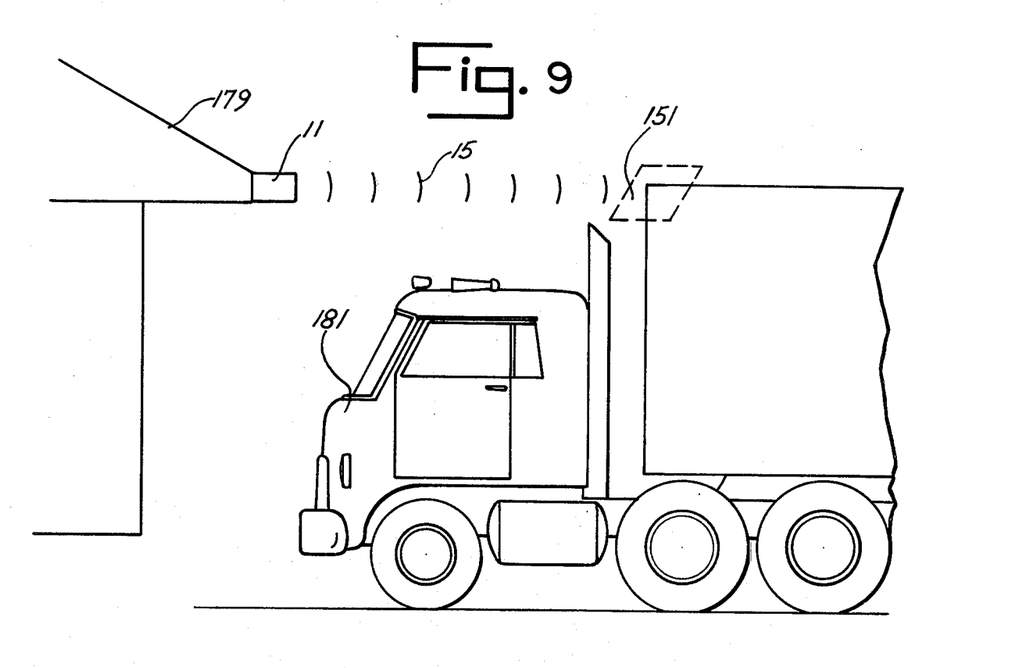
FIG. 9 is a side view of a preferred embodiment of an overhang protection system of the present invention.

Referring to FIG. 9, an overhang protection system is illustrated which includes proximity detector 11 of FIG. 1. Detector 11 is secured to an overhang 179 for monitoring an active area 151 positioned at a prescribed height above the ground for detecting when a truck 181, or the like, which is too high to pass beneath the overhang, moves into active area 151. An alarm system (not shown), such as a flashing light, bell, buzzer or the like, is initiated by detector 11 to signal the driver of the truck that the vehicle is too high to pass under the overhang. The coil 131 of the output circuitry of FIG. 4A can be utilized in a solenoid fashion to actuate the alarm system.

It should be understood, of course, that the foregoing disclosure relates to preferred embodiments of the invention and that other modifications or alterations may be made therein without departing from the spirit or scope of the invention as set forth in the appended claims.

We claim:

1. Proximity detection apparatus comprising:
   means for generating pulses of infrared radiation at a predetermined frequency along a preselected direction;
   infrared detector means positioned with respect to said generating means for producing an analog signal responsive to the detection of infrared radiation;
   synchronous monitoring means for receiving said analog signal and generating a first digital signal representative of infrared radiation detected in synchronization with generated infrared radiation, said monitoring means including missing pulse detection means for monitoring said first digital signal with respect to a first predetermined time period for generating a second digital signal representative of the frequency synchronization of detected infrared radiation and generated infrared radiation; and
   timer means for receiving said second digital signal and producing a third digital signal representative of said frequency synchronization occurring for at least a second predetermined time period.

2. Apparatus according to claim 1 wherein said first predetermined time period is a time period greater than once but less than twice the period of generation of said pulses of infrared radiation.

3. Apparatus according to claim 1 wherein said missing pulse detection means includes retriggerable monostable means responsive to said first digital signal for generating said second digital signal.

4. Apparatus according to claim 1 wherein said monitoring means generates said second digital signal with a continuous first binary value responsive to continual detection of radiation in synchronism with generated radiation.

5. Apparatus according to claim 1 and further including output circuitry means for performing an output function responsive to the production of said third digital signal.

6. Apparatus according to claim 1 wherein said timer means produces said third digital signal only during the generation of said second digital signal.

7. Apparatus according to claim 6 wherein said timer means includes a retriggerable monostable means actuable by the generation of said second digital signal.

8. Apparatus according to claim 7 wherein said timer means includes means for generating said third digital signal responsive both to the output of said monostable means and to said second digital signal.

9. Apparatus according to claim 1 wherein said means for generating infrared radiation includes means for producing a first electrical signal related substantially to the time of radiation generation; and wherein said synchronous monitoring means includes:

comparison means for comparing said first electrical signal with said analog signal, said comparison means producing said first digital signal.

10. Apparatus according to claim 9 wherein said comparison means includes means for performing a logic AND function of said analog signal and said first electrical signal.

11. Proximity detection apparatus comprising:

means for generating pulses of infrared radiation at a predetermined frequency along a preselected direction;

infrared detector means positioned with respect to said generating means for producing an analog signal responsive to the detection of infrared radiation;

synchronous monitoring means for receiving said analog signal and generating a first digital signal having a first binary state solely when infrared radiation is detected in synchronization with generated infrared radiation, said monitoring means including circuit means for monitoring said first digital signal with respect to a first predetermined time period and generating a second digital signal representative of the frequency synchronization of detected infrared radiation and generated infrared radiation; and timer means for receiving said second digital signal and producing a third digital signal representative of said frequency synchronization occurring for at least a second predetermined time period.

* * * * *